（12）United States Patent
Chen et al.

(10) Patent No.: US 10,305,465 B2
(45) Date of Patent: May 28, 2019

(54) TRANSFORMER DEVICE AND CONTROL METHOD THEREFOR

(71) Applicant: Wistron Corporation, New Taipei (TW)

(72) Inventors: Yuan-Tai Chen, New Taipei (TW); Chia-Hao Liang, New Taipei (TW)

(73) Assignee: Wistron Corporation, New Taipei (TW)

( * ) Notice: Subject to any disclaimer, the term of this patent is extended or adjusted under 35 U.S.C. 154(b) by 13 days.

(21) Appl. No.: 15/636,650

(22) Filed: Jun. 29, 2017

(65) Prior Publication Data

US 2018/0241385 A1     Aug. 23, 2018

(30) Foreign Application Priority Data

Feb. 23, 2017   (TW) .............................. 106106096 A

(51) Int. Cl.
| | |
|---|---|
| *H02J 7/00* | (2006.01) |
| *H03K 17/10* | (2006.01) |
| *H03K 17/691* | (2006.01) |
| *H02M 5/257* | (2006.01) |
| *H01F 19/08* | (2006.01) |
| *H02M 1/00* | (2006.01) |

(52) U.S. Cl.
CPC ........... *H03K 17/102* (2013.01); *H01F 19/08* (2013.01); *H02J 7/0004* (2013.01); *H02M 5/2573* (2013.01); *H03K 17/691* (2013.01); *H02M 2001/0009* (2013.01)

(58) Field of Classification Search
CPC .................................................. H02J 7/0004
USPC ....................................................... 320/108
See application file for complete search history.

(56) References Cited

U.S. PATENT DOCUMENTS

| 5,767,781 A | * | 6/1998 | Yavelberg ............ G01R 31/025 340/661 |
| 8,909,951 B2 | | 12/2014 | Lin et al. |
| 2004/0007917 A1 | * | 1/2004 | Wu ..................... H02J 13/0062 307/39 |

(Continued)

FOREIGN PATENT DOCUMENTS

CN          102866758          9/2015

OTHER PUBLICATIONS

"Office Action of Taiwan Counterpart Application," dated Dec. 19, 2017, p. 1-8, in which the listed references were cited.

*Primary Examiner* — Suchin Parihar
(74) *Attorney, Agent, or Firm* — JCIPRNET

(57) ABSTRACT

A transformer device and a control method for the transformer device are provided. The transformer device includes a transformer, an uplink cascade connection port, a downlink cascade connection port, and a controller. The controller is enabled when the transformer receives an input electric power, and the controller determines whether the uplink cascade connection port is connected to an uplink transformer device. When the uplink cascade connection port is connected to the uplink transformer device, the controller detects a downlink external transformer device connected to the downlink cascade connection port, reports a detection result to the uplink transformer device, and obtains a control signal from the uplink cascade connection port. The controller converts the input electric power into an output electric power according to the control signal and the transformer.

12 Claims, 4 Drawing Sheets

(56) References Cited

U.S. PATENT DOCUMENTS

| | | | |
|---|---|---|---|
| 2006/0171329 A1* | 8/2006 | Ying | H02J 13/0062 370/254 |
| 2015/0304064 A1* | 10/2015 | Mutalik | H04J 14/0221 398/48 |
| 2015/0370312 A1* | 12/2015 | Desposito | G06F 1/3206 713/323 |
| 2016/0226254 A1* | 8/2016 | Cheng | H02J 3/383 |

* cited by examiner

TRANSFORMER DEVICE AND CONTROL METHOD THEREFOR

CROSS-REFERENCE TO RELATED APPLICATION

This application claims the priority benefit of Taiwan application serial no. 106106096, filed on Feb. 23, 2017. The entirety of the above-mentioned patent application is hereby incorporated by reference herein and made a part of this specification.

BACKGROUND OF THE INVENTION

Field of the Invention

The invention relates to a transformer technology. More specifically, the invention relates to a transformer device and a control method therefore for connecting the transformer devices with one another to integrate output powers.

Description of Related Art

In recent years, consumer electronic products have been gradually categorized according to different functions. For instance, notebook computers are designed mainly for eSports, tablet computers for easy Internet access, Smartphones for portability and convenient use, etc. Since power consumptions of the consumer electronic products may vary when different functions are performed, transformers of the consumer electronic products are self-adapted according to respective requirements for the power consumptions, such that the transformers of the consumer electronic products may not be commonly used.

In other words, when a consumer electronic product is damaged or eliminated, a transformer corresponding to the consumer electronic product may not be used anymore, and electronic waste is thus created. Thereby, if the transformer technology with the same specification is applied, the transformers may be commonly used by different consumer electronic products. Nevertheless, output powers of the transformers are different, and thus the consumer electronic products which may be commonly used have to be adjusted by users.

SUMMARY OF THE INVENTION

The invention provides a transformer device and a control method therefor for connecting a plurality of transformer devices to one another to integrate or increase output powers of the transformer devices and adjust the number of the connected transformer devices; thereby, electricity output may be adaptively adjusted.

In an embodiment of the invention, a transformer device includes a transformer, an uplink cascade connection port, a downlink cascade connection port, and a controller. The uplink cascade connection port is coupled to an input terminal of the transformer. The downlink cascade connection port is coupled to an output terminal of the transformer. The controller is coupled to the uplink cascade connection port, the downlink cascade connection port, and the transformer. The controller is enabled when the transformer receives an input electric power, and the controller determines whether the uplink cascade connection port is connected to an uplink transformer device. When the uplink cascade connection port is connected to the uplink transformer device, the controller detects a downlink external transformer device connected to the downlink cascade connection port, reports a detection result to the uplink transformer device, and obtains a control signal from the uplink cascade connection port. The controller converts the input electric power into an output electric power by the transformer according to the control signal.

In an embodiment of the invention, a control method of a transformer device is adapted for a transformer device including an uplink cascade connection port, a downlink cascade connection port, and a transformer. The control method for connection includes the following steps. Whether the uplink cascade connection port is connected to an uplink transformer device is determined. A downlink external transformer device connected to the downlink cascade connection port is detected when the uplink cascade connection port is connected to the uplink transformer device. A detection result is reported to the uplink transformer device. A control signal is obtained from the uplink cascade connection port. An input electric power is converted into an output electric power by the transformer according to the control signal.

In view of the foregoing, the transformer device provided by the embodiments of the invention may be informed of other transformer devices connected thereto (the transformer devices connected to one another may be referred to as the connected transformer devices) through the uplink cascade connection port and the downlink cascade connection port. The transformer device may further learn the information including the voltage conversion powers of the transformer devices. Moreover, the control signal may be generated by the first transformer device of the connected transformer devices and transmitted to other connected transformer devices, such that the connected transformer devices may work collaboratively. As such, in the embodiments of the invention, multiple transformer devices may be connected to one another to integrate or increase output powers of the transformer devices, and the number of the connected transformer devices may be adjusted to modify the electricity output adaptively.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
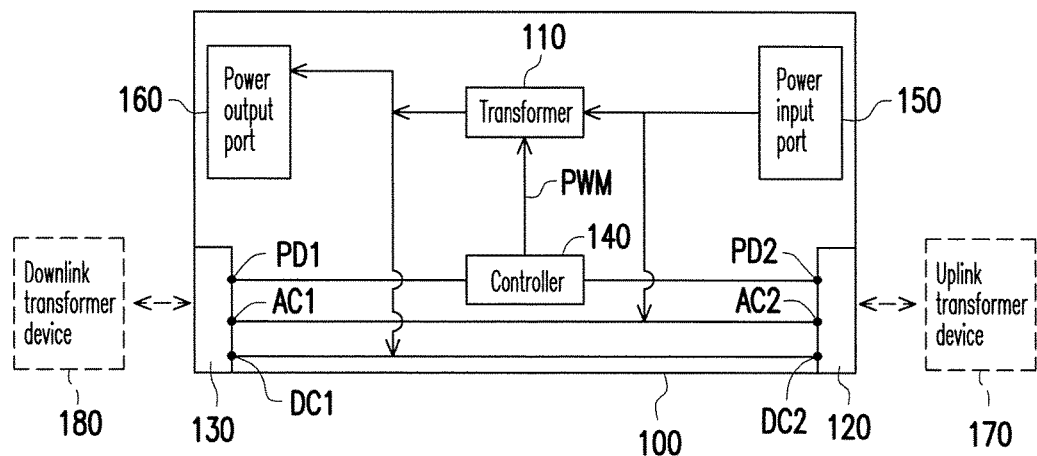
FIG. 1 is a block view illustrating functions of a transformer device according to an embodiment of the invention.
Figure 2:
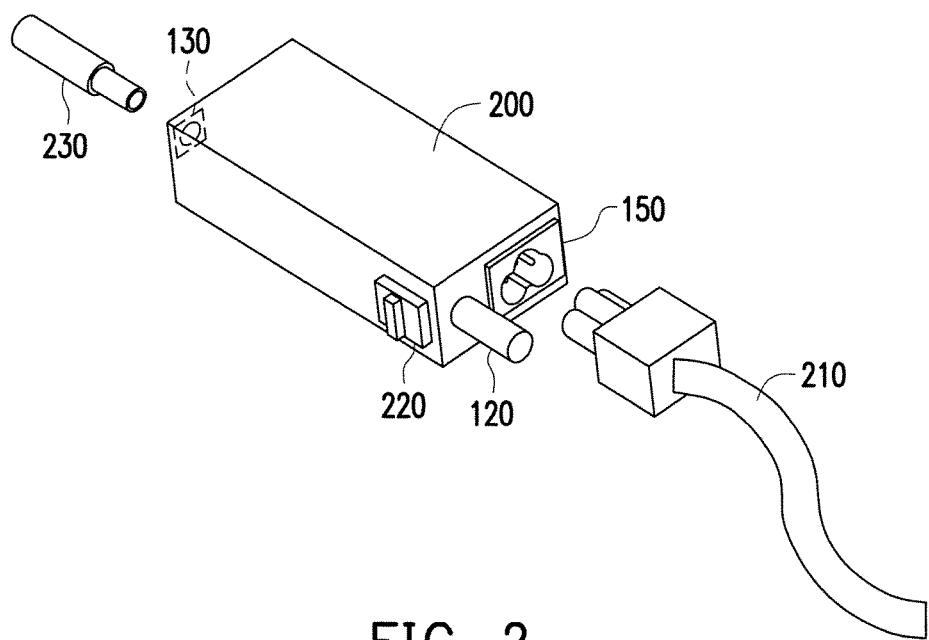
FIG. 2 and FIG. 3 are schematic views of an appearance of a transformer device.
Figure 3:
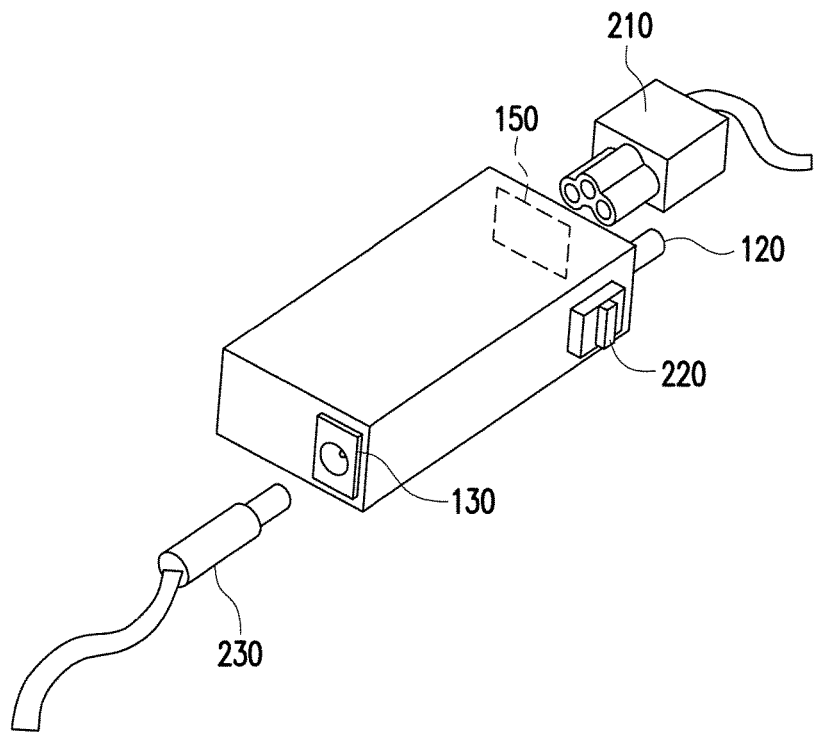

FIG. 1 is a block view illustrating functions of a transformer device 100 according to an embodiment of the invention. FIG. 2 and FIG. 3 are schematic views of an appearance of the transformer device 100. Referring to FIG. 1, FIG. 2, and FIG. 3, the transformer device 100 mainly includes a transformer 110, an uplink cascade connection port 120, a downlink cascade connection port 130, and a controller 140. The transformer device 100 may be applied to various types of consumer electronic devices and used mainly for converting an input electric power (e.g., mains electricity and alternating current) into an output electric power (e.g., direct current). The transformer device 100 may also selectively include a power input port 150 and a power output port 160.

The uplink cascade connection port 120 and the downlink cascade connection port 130 are configured to act as connection ports to connect other transformer devices (e.g., the uplink transformer device 170 and the downlink transformer device 180 shown in FIG. 1) to the transformer device 100. The uplink cascade connection port 120 includes a detection pin PD2, an input power terminal AC2, and an output power terminal DC2. The downlink cascade connection port 130 includes a detection pin PD1, an input power terminal AC1, and an output power terminal DC1. The input power terminal AC2 of the uplink cascade connection port 120 is coupled to an input terminal of the transformer 110 and the input power terminal AC1 of the downlink cascade connection port 130. Moreover, the output power terminal DC2 of the uplink cascade connection port 120 is coupled to an output terminal of the transformer 110 and the output power terminal DC1 of the downlink cascade connection port 130. Thereby, the connected transformer devices may obtain identical input electric powers and provide output electric powers.

If the uplink transformer device 170 is connected to the transformer device 100 through the uplink cascade connection port 120, the controller 140 provided by the embodiment may obtain a control signal from the uplink transformer device 170 through the detection pin PD2 of the uplink cascade connection port 120. By contrast, if the downlink transformer device 180 is connected to the transformer device 100 through the downlink cascade connection port 130, the controller 140 provided by the embodiment may transmit the control signal obtained from the uplink transformer device 170 to the downlink transformer device 180 through the detection pin PD1 of the downlink cascade connection port 130. Alternatively, the controller 140 may transmit a control signal generated by itself to the downlink transformer device 180. In other embodiments of the invention, an additional control signal terminal may be disposed at the uplink cascade connection port 120 and the downlink cascade connection port 130 in the transformer device 100. The controller 140 may thus receive the control signal from or transmit the control signal to other transformer devices through the control signal terminal. The controller 140 may generate a pulse width modulation (PWM) signal PWM according to the control signal and control the transformer device 100 to convert the input electric power into the output electric power according to the signal PWM.

Referring to FIG. 2 and FIG. 3, the transformer device 100 has a shell 200. The shell 200 mainly includes the uplink cascade connection port 120, the downlink cascade connection port 130, and a power input port 150. The power input port 150 may be electrically connected to a cable line 210 to receive mains electricity. A pushing lever 220 linked to the uplink cascade connection port 120 may be disposed on the shell 200. A user may push the pushing lever 220 when necessary, such that the uplink cascade connection port 120 selectively extends out of the shell 200 or is hidden inside the shell 200. In the embodiment, the uplink cascade connection port 120 is in a male form; in other words, the uplink cascade connection port 120 is shaped as a protruding cylinder. The downlink cascade connection port 130 is in a female form; in other words, the downlink cascade connection port 130 is shaped as a cylindrical hole.

Figure 4:
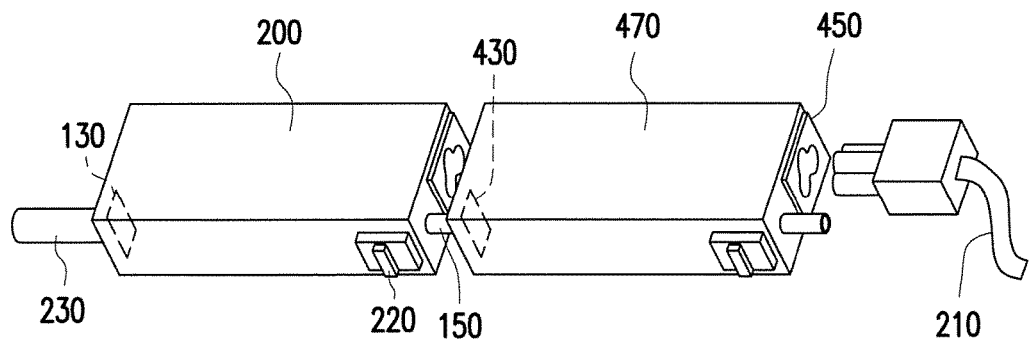
FIG. 4 is a schematic view illustrating two transformer devices connected to each other.

When the uplink cascade connection port 120 extends out of the shell 200, the uplink cascade connection port 120 may be connected to the uplink transformer device 170, as shown in FIG. 4. FIG. 4 is a schematic view illustrating two transformer devices connected to each other. A shell 470 of the uplink transformer device 170 and the shell 200 of the transformer device 100 are depicted in FIG. 4. A structure of the transformer device 100 provided by the embodiment and a structure of the uplink transformer device 170 may be similar. The uplink cascade connection port 120 of the transformer device 100 extends out of the shell 200 and is inserted into a downlink cascade connection port 430 on the shell 470 of the uplink transformer device 170. A power input port 450 of the uplink transformer device 170 is connected to the cable line 210, and the downlink cascade connection port 130 of the transformer device 100 is connected to a cable line 230 connected to an consumer electronic device. Thereby, the uplink transformer device 170 and the transformer device 100 are connected to each other. The transformer device 100 and the downlink transformer device 180 are connected in a manner similar to that of the uplink transformer device 170 and the transformer device 100 in FIG. 4. In the embodiment, a plurality of transformer devices may be connected rather than just two transformer devices connected to each other, as shown in FIG. 4. Moreover, each of the transformer devices may work as a single transformer.

Referring to FIG. 3, in the transformer device 100 provided by the embodiment, the downlink cascade connection port 130 and the power output port 160 share the same connection hole because the cable line 230 connected to the downlink cascade connection port 130 or the power output port 160 is configured to be connected with the consumer electronic device, and the downlink cascade connection port 130 is equipped with the output power terminal DC1 as well. Therefore, the cable line 230 may be designed together with the transformer device 100, such that the cable line 230 may be designed to be complied with the plug specifications of the downlink cascade connection port 130.

Figure 5:
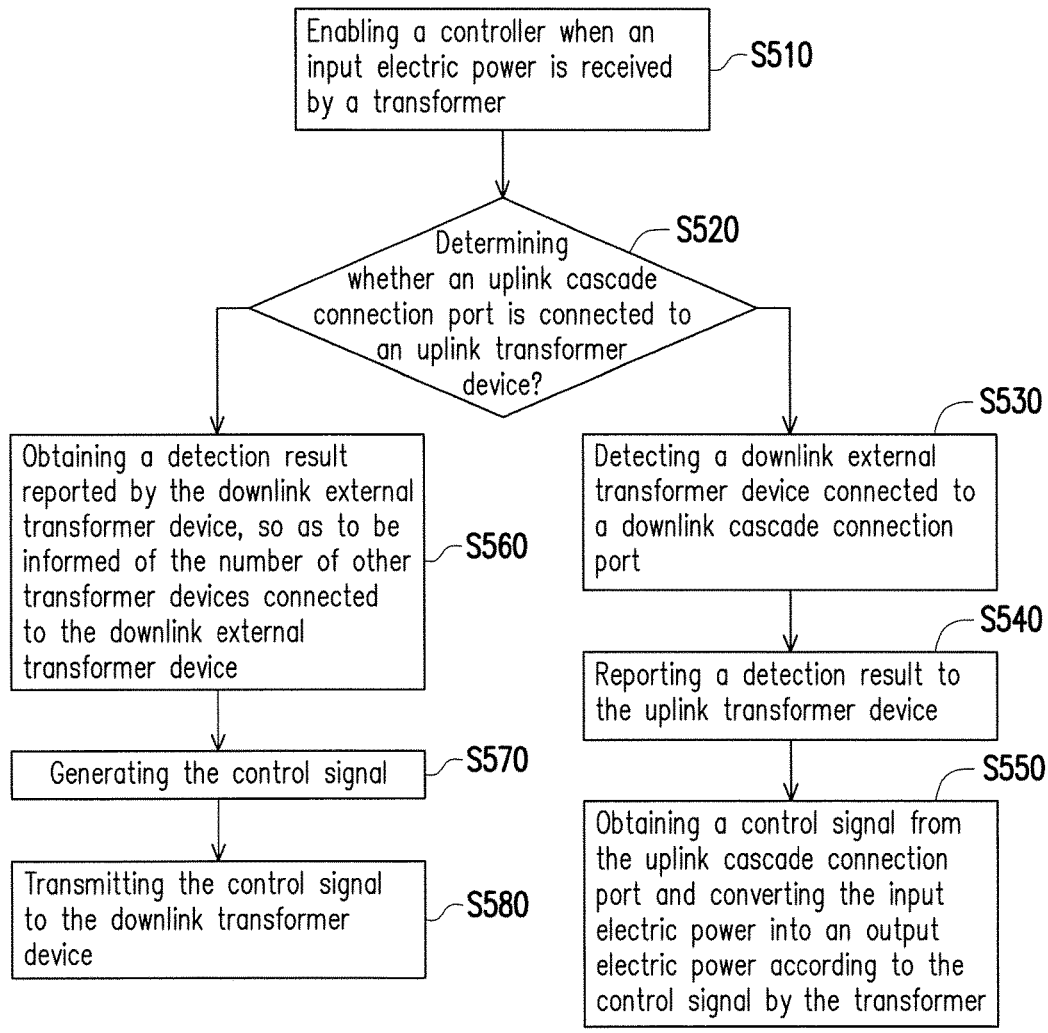
FIG. 5 is a flowchart of a control method of a transformer device according to an embodiment of the invention.

FIG. 5 is a flowchart of a control method of a transformer device according to an embodiment of the invention. Referring to FIG. 1 and FIG. 5, in step S510, the controller 140 is enabled when an input electric power is received by the transformer 110. A time point when the input electric power is received by the transformer 110 may be the time when a cable line is inserted into the power input port 150 and the input electric power is obtained. Alternatively, the input electric power may also be provided by other transformer devices connected to the uplink cascade connection port 120 or the downlink cascade connection port 130 and may be transmitted to the transformer 110 through the input power terminal AC1 of the downlink cascade connection port 130 or the input power terminal AC2 of the uplink cascade connection port 120.

In step S520, whether the uplink cascade connection port 120 is connected to the uplink transformer device 170 is determined by the controller 140. When the uplink cascade connection port 120 is connected to the uplink transformer device 170, it indicates that the transformer device 100 is not the first transformer device of the connected transformers. Thereby, the control method proceeds to step S530 after step S520. In step S530, the controller 140 detects whether the downlink external transformer device 180 is connected to the downlink cascade connection port 130. In the embodiment, the first transformer device of the connected transformers acts as the main transformer device for generating the control signal. Any of the transformer devices of the connected transformers may be used as the main device for generating the control signal according to actual requirements. In the embodiment, a structure of the connected transformer devices is similar to that of a multi-phase buck converter, and therefore a similar control signal may be generated by the main transformer device generating the control signal because of the structure of the multi-phase buck converter. As such, the transformer devices become the assembled multi-phase power converters.

In the embodiment, when the downlink transformer device is detected by the transformer device 100, the transformer device 100 may not only be informed of whether the downlink transformer device 180 is connected to the transformer device 100 but also be informed of whether the downlink transformer device 180 is further connected to other transformer devices, and the number of the transformer devices connected to the downlink cascade connection port 130 may be obtained. The number of the connected transformer devices must be learned by the first transformer device, so as to generate a corresponding control signal. In addition, voltage conversion powers of the downlink transformer device 180 and other connected transformer devices may be detected by the transformer device 100, and the detection result is reported to the first transformer device.

In step S540, the detection result generated in step S530 is reported to the uplink transformer device 170 by the controller 140. In step S550, the control signal provided by the uplink transformer device 170 is obtained from the uplink cascade connection port 120 by the controller 140 after the detection result is reported, and the input electric power is converted into the output electric power with the transformer 110 by the controller 140 according to the control signal.

By contrast, if it is determined that the uplink cascade connection port 120 is not connected to the uplink transformer device 170, it indicates that the transformer device 100 is the first transformer device of the connected transformers. Thereby, the control method proceeds to step S560 after step S520. In step S560, a detection result reported by the downlink transformer device 180 is obtained by the controller 140 through the downlink cascade connection port 130, such that the controller 140 is informed of the number of other transformer devices connected to the downlink transformer device 180. Furthermore, the controller 140 may also be informed of the voltage conversion powers of the transformer devices. If the transformer device 100 is neither connected to the uplink transformer device 170 nor connected to the downlink transformer device 180, the transformer 110 is controlled to act as a single transformer by the controller 140.

In step S570, a control signal is generated by the controller 140 according to the detection result reported by the downlink transformer device 180. The control signal provided by the embodiment includes one or a combination of the voltage conversion power, a synchronization signal, and a distribution ratio of a start-up time of each of the transformer devices. Moreover, in step S580, the control signal is transmitted to the downlink transformer device 180 by the controller 140, such that electric power conversion may be performed by the downlink transformer device 180 and other transformer devices connected to the downlink transformer device 180.

Figure 6:
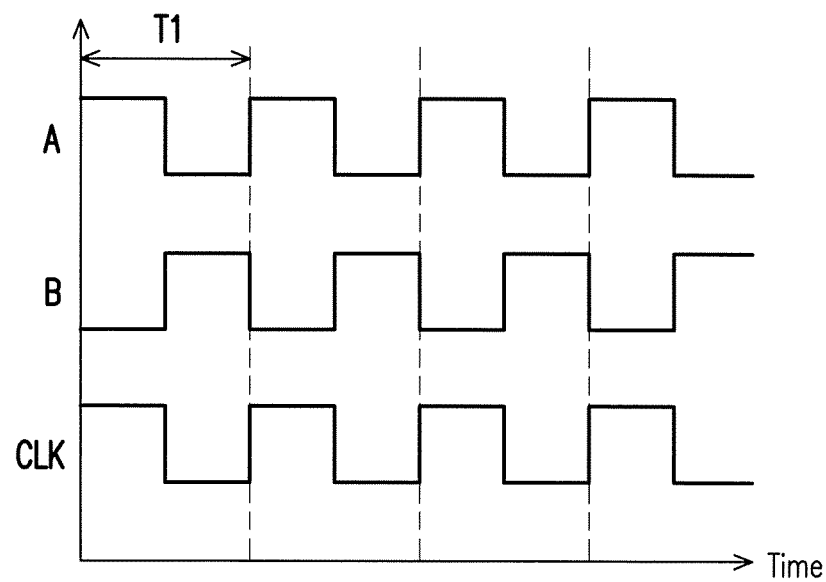
FIG. 6 is a timing chart of a control signal and a synchronous clock signal of two connected transformer devices.

In an exemplary structure of the connected transformer devices 100 and 170 as illustrated in FIG. 4, the control signal is generated by the first transformer device 170 and transmitted to the transformer device 100 through the downlink cascade connection port of the transformer device 170. It is assumed that the voltage conversion powers of the transformer devices 100 and 170 are both 50 watts. As such, output conversion is performed by the uplink transformer device 170 and the transformer device 100 in a manner as depicted in FIG. 6. FIG. 6 is a timing chart of a control signal and a synchronous clock signal of two connected transformer devices. In FIG. 6, a control signal A is the PWM signal configured to control the transformers in the uplink transformer device 170, while a control signal B is the PWM signal configured to control the transformers in the transformer device 100. A signal CLK is the synchronous clock signal. It can be seen that in FIG. 6, during a period T1 of the synchronous clock signal CLK, a first half of the period T1 is started up first by the transformers in the uplink transformer device 170 according to the control signal A. In other words, in the first half of the period T1, the control signal A is in a logic 1 state, and the control signal B is in the logic 0 state. The other half of the period T1 is started up by the transformers in the transformer device 100 according to the control signal B. In other words, in the second half of the period T1, the control signal A is in the logic 0 state, and the control signal B is in the logic 1 state.

Figure 7:
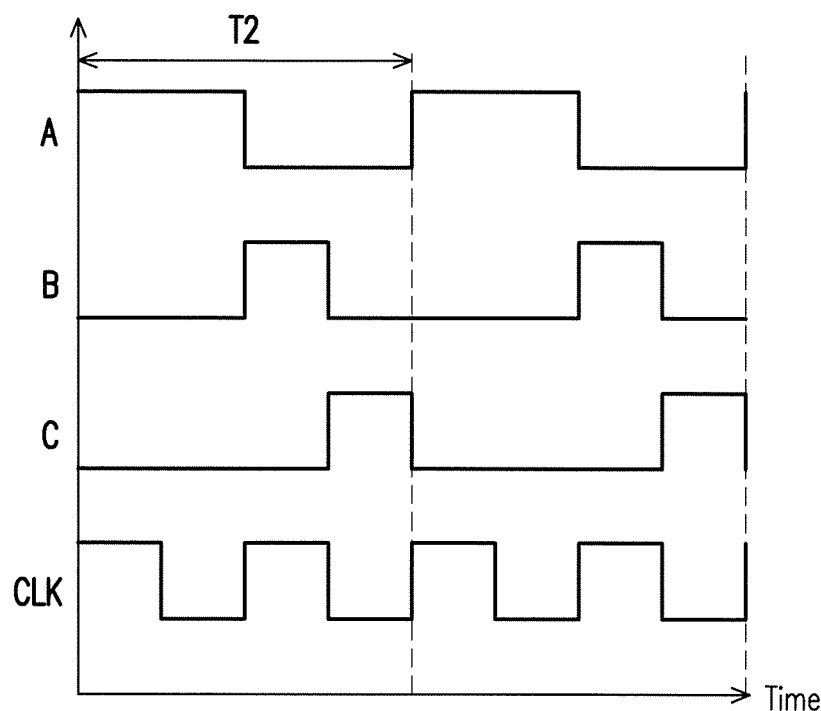
FIG. 7 is a timing chart of a control signal and a synchronous clock signal of three connected transformer devices.

For instance, if three transformer devices are connected to one another, it is assumed that the voltage conversion powers of the three transformer devices are respectively be 100 watts, 50 watts, and 50 watts. The voltage conversion powers of the transformer devices are different, such that in a control signal generated by the first transformer device, the start-up times of the transformers in the transformer devices are properly adjusted according to the voltage conversion powers. For instance, the distribution ratio of the start-up times of the transformers is 2:1:1, and said distribution ratio may be included in the control signal generated by the first transformer device, such that output conversion is performed by the transformer devices in a manner as depicted in FIG. 7. FIG. 7 is a timing chart of a control signal and a synchronous clock signal of three connected transformer devices. In FIG. 7, the control signal A is the PWM signal configured to control the transformers in the first transformer device (with a voltage conversion power of 100 watts), the control signal B is the PWM signal configured to control the transformers in the second transformer device (with a voltage conversion power of 50 watts), and a control signal C is the PWM signal configured to control the transformers in the third transformer device (with a voltage conversion power of 50 watts). The signal CLK is the synchronous clock signal. It can be seen that in FIG. 7, during a period T2 of the synchronous clock signal CLK, a first half of the period T2 is started up by the transformers in the first transformer device according to the control signal A. The remaining two quarters of the period T2 are started up by the transformers in the second transformer device and the third transformer device according to the control signal B and the control signal C.

To sum up, the transformer device provided by the embodiments of the invention may be informed of other transformer devices connected thereto (the transformer devices connected to one another may be referred to as the connected transformer devices) through the uplink cascade connection port and the downlink cascade connection port. The transformer may further learn the information including the voltage conversion powers of the transformer devices. Moreover, the control signal may be generated by the first transformer device of the transformer devices and transmitted to other connected transformer devices, such that the connected transformer devices may work collaboratively. Thereby, in the embodiments of the invention, multiple transformer devices may be connected to one another to integrate or increase output powers of the transformer devices, and the number of the connected transformer devices may be adjusted to modify the electricity output adaptively It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A transformer device, comprising:
a transformer;
an uplink cascade connection port, coupled to an input terminal of the transformer;
a downlink cascade connection port, coupled to an output terminal of the transformer; and
a controller, coupled to the uplink cascade connection port, the downlink cascade connection port, and the transformer,
wherein the controller is enabled when the transformer receives an input electric power, and the controller determines whether the uplink cascade connection port is connected to an uplink transformer device through the uplink cascade connection port,
wherein when the uplink cascade connection port is connected to the uplink transformer device, the controller detects a downlink external transformer device connected to the downlink cascade connection port, reports a detection result to the uplink transformer device, and obtains a control signal from the uplink cascade connection port, wherein the controller converts the input electric power into an output electric power by the transformer according to the control signal.

2. The transformer device as claimed in claim 1, wherein when the uplink cascade connection port is not connected to the uplink transformer device, the controller obtains the detection result reported by the downlink external transformer device through the downlink cascade connection port and is informed of number of other transformer devices connected to the downlink external transformer device, so as to generate the control signal and transmit the control signal to the downlink external transformer device.

3. The transformer device as claimed in claim 1, wherein the control signal comprises one or a combination of a voltage conversion power, a synchronization signal, and a distribution ratio of a start-up time of the transformer of the transformer device.

4. The transformer device as claimed in claim 1, wherein the uplink cascade connection port and the downlink cascade connection port comprise detection pins, input power terminals, and output power terminals, wherein the input power terminal of the uplink cascade connection port is coupled to the input terminal of the transformer and the input power terminal of the downlink cascade connection port, and the output power terminal of the uplink cascade connection port is coupled to the output terminal of the transformer and the output power terminal of the downlink cascade connection port.

5. The transformer device as claimed in claim 1, wherein the uplink cascade connection port is in a male form, and the downlink cascade connection port is in a female form.

6. The transformer device as claimed in claim 5, wherein a pushing lever linked to the uplink cascade connection port is disposed on a shell of the transformer device, such that the downlink cascade connection port selectively extends out of the shell or is hidden inside the shell.

7. The transformer device as claimed in claim 1, further comprising:
an power input port, coupled to the input terminal of the transformer for supplying the input electric power.

8. A control method of a transformer device, wherein the transformer device comprises an uplink cascade connection port, a downlink cascade connection port, and a transformer, and the control method comprises:
determining whether the uplink cascade connection port is connected to an uplink transformer device;
detecting a downlink external transformer device connected to the downlink cascade connection port in response to the uplink cascade connection port is connected to the uplink transformer device;
reporting a detection result to the uplink transformer device; and
obtaining a control signal from the uplink cascade connection port, wherein the transformer converts an input electric power into an output electric power according to the control signal.

9. The control method as claimed in claim 8, further comprising:
transmitting the control signal to the downlink external transformer device in response to the uplink cascade connection port obtains the control signal.

10. The control method as claimed in claim 8, further comprising:
obtaining the detection result reported by the downlink external transformer device through the downlink cascade connection port in response to the uplink cascade connection port is not connected to the uplink transformer device, so as to be informed of a number of other transformer devices connected to the uplink transformer device;
generating the control signal according to the detection result; and
transmitting the control signal to the downlink external transformer device.

11. The control method as claimed in claim 8, wherein the control signal comprises one or a combination of a voltage conversion power, a synchronization signal, and a distribution ratio of a start-up time of the transformer device.

12. The control method as claimed in claim 8, wherein the uplink cascade connection port and the downlink cascade connection port comprise detection pins, input power terminals, and output power terminals, wherein the input power terminal of the uplink cascade connection port is coupled to the input terminal of the transformer and the input power terminal of the downlink cascade connection port, and the output power terminal of the uplink cascade connection port is coupled to the output terminal of the transformer and the output power terminal of the downlink cascade connection port.

* * * * *